(12) United States Patent
Kaul et al.

(10) Patent No.: US 10,840,674 B2
(45) Date of Patent: Nov. 17, 2020

(54) DIODE LASER WITH IMPROVED MODE PROFILE

(71) Applicant: FORSCHUNGSVERBUND BERLIN E.V., Berlin (DE)

(72) Inventors: Thorben Kaul, Berlin (DE); Götz Erbert, Löbau (DE); Paul Crump, Berlin (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 16/478,558

(22) PCT Filed: Jan. 25, 2018

(86) PCT No.: PCT/EP2018/051856
§ 371 (c)(1),
(2) Date: Jul. 17, 2019

(87) PCT Pub. No.: WO2018/138209
PCT Pub. Date: Aug. 2, 2018

(65) Prior Publication Data
US 2020/0052465 A1 Feb. 13, 2020

(30) Foreign Application Priority Data
Jan. 25, 2017 (DE) .................. 10 2017 101 422

(51) Int. Cl.
*H01S 5/20* (2006.01)
*H01S 5/343* (2006.01)

(52) U.S. Cl.
CPC .......... *H01S 5/2031* (2013.01); *H01S 5/3432* (2013.01); *H01S 5/34313* (2013.01)

(58) Field of Classification Search
CPC .................. H01S 5/2031; H01S 5/34313
See application file for complete search history.

(56) References Cited

U.S. PATENT DOCUMENTS 8,798,109 B2   8/2014   Götz et al.
9,042,416 B1   5/2015   Ho et al.
(Continued)

OTHER PUBLICATIONS

Crump, "Efficient High-Power Laser Diodes," IEEE Journal of Selected Topics in Quantum Electronics, Jul./Aug. 2013, vol. 19, No. 4, pp. 1-11. (Year: 2013).*

(Continued)

*Primary Examiner* — Michael Carter
(74) *Attorney, Agent, or Firm* — Norris McLaughlin, P.A.

(57) ABSTRACT

A diode laser comprises an n-type first cladding layer, an n-type first waveguide layer arranged on the first cladding layer, an active layer suitable for radiation generation and arranged on the first waveguide layer, a p-type second waveguide layer arranged on the active layer, a p-type second cladding layer which is arranged on the second waveguide layer, an n-type first intermediate layer being formed as a transition region between the first waveguide layer and the active layer, and a p-type second intermediate layer being formed as a transition region between the second waveguide layer and the active layer. The diode laser according to the invention is characterized in that the asymmetry ratio of the thickness of the first intermediate layer to the sum of the thickness of the first intermediate layer and the thickness of the second intermediate layer is less than or greater than 0.5.

11 Claims, 7 Drawing Sheets

(56) References Cited

U.S. PATENT DOCUMENTS

| | | |
|---|---|---|
| 2001/0009558 A1 | 7/2001 | Shigihara |
| 2004/0013147 A1 | 1/2004 | Buda et al. |
| 2010/0195687 A1* | 8/2010 | Okamoto ............... B82Y 20/00 372/45.012 |

OTHER PUBLICATIONS

Hasler, "Comparative theoretical and experimental studies of two designs oh high-power diode lasers", Semiconductor Science and Technology, 2014, 29, 045010, pp. 2-6. (Year: 2014).*

English translation of International Search Report dated Apr. 13, 2018 in connection with International Application No. PCT/EP2018/051856.

International Search Report dated Apr. 13, 2018 in connection with International Application No. PCT/EP2018/051856.

D. Botez, "Design Considerations and Analytical Approximations for High Continuous-wave power, broad-waveguide lode lasers", Appl. Phys. Lett., vol. 74 No. 21, pp. 3102-3104, (1999).

Crump et al., "Efficient High-Power Laser Diodes", IEEE J. Sel. Top. Quant. Electron., vol. 19, No. 4, 1501211, (2013).

Hasler et al., "Comparative Theoretical and Experimental Studies of Two Designs of High-Power Diode lasers", Semicond. Sci. Technol. vol. 29, 045010 (2014).

T. Kaul et al., "Studies of Liminations to Peak Power and Efficiency in Diode Lasers Using Extreme-double-asymmetric Vertical Designs", Proc. 25th International Semiconductor Laser Conference (ISLC 2016), Kobe, Japan, Sep. 12-15, p. WD4 (2016).

M. Winterfeldt et al., "Assessing the Influence of the Vertical Expitaxial Layer Design on the Lateral Beam Quality of High-Power Broad Area Diode Lasers", Proc. SPIE 9733, 97330O (2016).

* cited by examiner

DIODE LASER WITH IMPROVED MODE PROFILE

This application is the U.S. National Stage of International Application No. PCT/EP2018/051856, filed Jan. 25, 2018, which claims foreign priority benefit under 35 U.S.C. § 119 of German Application No. 10 2017 101 422.5, filed Jan. 25, 2017.

DESCRIPTION

The present invention concerns a diode laser with an improved mode profile.

STATE OF THE ART

In general, edge-emitting laser diodes (diode lasers) have an active layer embedded in semiconductor layers which differ from each other in their band gaps, refractive indices and doping. The layers below and above the active layer differ in particular in the doping type (n or p). In addition to ensuring the transport of electrons and holes to the active layer, where they stimulately recombine and generate laser radiation, these layers serve the vertical guidance of the laser light. The layers adjacent to the active layer are called waveguide layers, the layers adjacent to these waveguide layers are called cladding layers. Typically, the refractive index of the active layer is greater than that of the waveguide layers and the refractive index of the waveguide layers is greater than that of the cladding layers. However, other configurations are also possible (e.g. Vertical ARROW, Photonic Band Crystal).

Wide-strip semiconductor lasers in particular are in great demand in industry due to their high performance. Stable optical powers can be achieved from a 100 μm wide strip of over 15 W at 15 A diode current from a single laser diode.

Power characteristics of broadband lasers have already been published by numerous authors, whereby in particular conventional and extreme double asymmetric structures (EDAS) have been investigated. Such an EDAS design is known for example from U.S. Pat. No. 8,798,109 B2. The main advantages of EDAS-based laser diodes compared to other broad-spectrum laser concepts are a particularly high efficiency, low optical losses and a low ohmic resistance. However, the behavior of diodes with EDAS design and 100 μm wide stripes has so far only been investigated at room temperature. However, for powers greater than approx. 10 W, these diodes show conversion efficiencies that are significantly higher than those achievable with conventional structures, as in Hasler et al. Semicond. Sci. Technol. 29, p. 045010 (2014) and Crump et al., IEEE J. Sel. Top. Quant. Electron. 19(4), 1501211 (2013). It has been shown that diodes with EDAS design exhibit significantly lower series resistance (up to 40%) and reduced loss mechanisms (e.g. band edge bending, charge carrier accumulation in the optical waveguide and voltage and temperature driven leakage currents) due to their narrow p-side waveguide (thinner than 150 nm, n waveguide thicker than 1 μm).

In order to reduce the significant influence of the p-type waveguide layer on optical loss and ohmic resistance, the EDAS design provides double asymmetry in the waveguide region, shifting the energy of the developing (fundamental) mode to the n-type side. A disadvantage of the EDAS design, however, is that the maximum of the fundamental mode shifts away from the active zone into the n-range due to the narrow p-waveguide. This reduces optical mode confinement within the active zone, dramatically increasing threshold current and consistently reducing maximum conversion efficiency. In addition, as explained in T. Kaul et al., Proc. 25th International Semiconductor Laser Conference (ISLC 2016), Kobe, Japan, Sep. 12-15, p. WD4 (2016), a high optical mode confinement is also necessary for the realization of temperature insensitive diode lasers.

Previous studies emphasize that the mode inclusion factor can be increased by shifting the quantum film towards the n region or by using a multi-quantum film configuration. In the first case one does not get the advantages of an EDAS design mentioned above. In the second case, there is a drastic increase in transparency current density and, as a result, an unavoidable increase in threshold current and a reduction in conversion efficiency, which is why vertical layer structures with only one quantum film are advantageous.

DISCLOSURE OF THE INVENTION

It is therefore a task of the present invention to specify a diode laser with an improved mode profile which overcomes the described disadvantages of the state of the art. In particular, a diode laser according to the invention should be based on an EDAS design with only one quantum film and exhibit a high optical mode confinement, wherein neither the quantum film is shifted into the n-range nor a wider active zone is required.

These tasks are solved according to the invention by the features of patent claim 1. Appropriate forms of the invention are contained in the subclaims.

A diode laser according to the invention comprises an n-type first cladding layer, an n-type first waveguide layer disposed on said first cladding layer, an active layer suitable for radiation generation disposed on said first waveguide layer, a p-conductively formed second waveguide layer disposed on said active layer, a p-conductively formed second cladding layer disposed on said second waveguide layer, wherein an n-type first intermediate layer is formed as a transition region between said first waveguide layer and said active layer, and a p-type second intermediate layer is formed as a transition region between said second waveguide layer and said active layer. The diode laser according to the invention is characterized in that the asymmetry ratio of the thickness of the first intermediate layer to the sum of the thickness of the first intermediate layer and the thickness of the second intermediate layer is greater than 0.5. Another variant according to the invention is the use of an asymmetry ratio of less than 0.5, which allows a smaller vertical far field angle without varying the waveguide thickness.

Preferably the first intermediate layer is a GRIN layer. In a first embodiment, the second p-type intermediate layer can be a GRIN layer. In a second embodiment, the second p-type intermediate layer can be a layer with a constant refractive index or material composition.

In a preferred embodiment, the layer thickness of the second waveguide layer is between 3 nm and 350 nm, since an electron wave in the active layer can be efficiently kept away from the cladding layer with layer thicknesses greater than 3 nm. In a particularly preferred version, the layer thickness of the second waveguide layer is between 5 nm and 350 nm, more preferably between 5 nm and 150 nm, more preferably between 5 nm and 100 nm, more preferably between 5 nm and 60 nm, and even more preferably between 5 nm and 30 nm.

A transition region is a region between two layers in which the local refractive indices at the facing edges of the two layers are adapted to each other (a corresponding intermediate layer can also be referred to as a refractive index adaptation layer). In the case of differing refractive indices at the said edges, a continuous transition (e.g. linear spatial refractive index progression) between these refractive indices preferably takes place within the transition range. With the same refractive indices at the said edges, there is preferably no variation of the refractive index (constant spatial refractive index progression) between these refractive indices within the transition range. Preferably a transition area is a GRIN layer.

The GRIN layer (GRIN—Gradient Index) is a layer whose refractive index has a gradient along the layer thickness. In particular, these are layers in which the refractive index increases or decreases from a first value on a first side of the layer to a second value unequal to the first value on a side of the layer opposite the first side (transverse to the direction of propagation of light). Preferably this transition is continuous. Also preferably there is a monotonous relationship between refractive index and layer thickness, preferably a polynomial or an exponential relationship and even more preferably a linear relationship.

Preferably at least one of the two waveguide layers contains a refractive index gradient. In the case of one or more waveguide layers with a refractive index gradient, the difference between the refractive index of a waveguide layer and the refractive index of an associated cladding layer is always calculated using the largest amount of the refractive index in the respective layer (i.e. the layer with the refractive index gradient). According to the present invention, a layer (waveguide layer) with a refractive index gradient is defined as a layer (waveguide layer) whose refractive index varies along the layer thickness axis (transverse to the direction of light propagation). Preferably, the refractive index varies from a first value at the first interface (to the cladding layer) to a second value at the second interface (to the intermediate layer).

All refractive indices refer to the central wavelength of the radiation emitted or amplified by the active layer. The central wavelength of the radiation emitted by the active layer is preferably between 380 nm and 10 μm, more preferably between 380 nm and 1200 nm, more preferably between 700 nm and 1000 nm and even more preferably between 900 nm and 1000 nm.

The idea of the present invention is to give an additional asymmetric component to the transition region near the active layer, especially near a single quantum film as the active layer. This allows the mode properties and in particular the mode profile and the spatial position of the mode maximum in relation to the active layer to be specifically influenced and controlled. In particular, a triple asymmetry in the layer structure (asymmetric n- and p-waveguide layers, asymmetric n- and p-cladding layers as well as asymmetric n-, p-intermediate layers) is realized according to the invention.

This method of mode influencing is particularly interesting for laser diodes with EDAS design, since in symmetrical structures the introduction of such an asymmetric component in the transition areas shows less influence on the diode behavior due to the centered mode guidance. An EDAS design extended by such an additional asymmetric component is referred to in the following as Extreme Triple Asymmetric Structure (ETAS). In particular, the idea of the present invention is suitable for leaving the p-waveguide untouched in an EDAS-design laser diode and modifying the mode confinement in the active layer as well as the vertical far field angle by the additional asymmetric component in the transition areas to the active layer. The application of the asymmetrical design of the n- and p-side transition areas between the waveguide layers and the active layer according to the invention is not limited to laser diodes with EDAS design.

In a laser diode according to the invention with ETAS design, for an asymmetry in which the ratio of the thickness of the first intermediate layer to the sum of the thickness of the first intermediate layer and the thickness of the second intermediate layer is greater than 0.5, the guided fundamental mode shifts in the direction of the active layer or quantum film. This increases the optical power density of the fundamental mode in the near field and the modal inclusion in the active layer (mode inclusion $\Gamma$). FIG. 4 $a$) shows, for example, that the mode inclusion r can be significantly increased if the thickness of the n-side intermediate layer is increased while the thickness of the p-side intermediate layer remains the same. In an exemplary conventional EDAS structure with single quantum films and symmetrical GRIN interlayers $\Gamma=0.2\%$ (see M. Winterfeldt et al., Proc. SPIE 9733, 973300 (2016)). In particular, this ETAS technology can almost triple the mode inclusion $\Gamma$ from 0.2% to 0.6% for this example, without having to change the p region of a conventional EDAS laser diode. Thus, all positive characteristics of the conventional EDAS design can be retained. A further finding is that with an asymmetric ETAS structure (see FIG. 4$a$ compared to FIG. 4$c$) with a layer thickness of the second GRIN intermediate layer of 70 nm, an almost identical mode inclusion can be achieved as with an EDAS structure more than twice as wide (150 nm). This strategy enables significantly increased conversion efficiencies at high optical power to be generated from semiconductor lasers with ETAS design and is essential for the high efficiency high power laser diode market. The present invention makes it possible to extend the use of EDAS-designed laser diodes to the high-temperature range.

For ETAS-design laser diodes in which the ratio of the thickness of the first intermediate layer to the sum of the thickness of the first intermediate layer and the thickness of the second intermediate layer is less than 0.5, the additional asymmetric component in the transition regions to the active layer results in a shift of the mode maximum in the direction of the n region, resulting in a widening of the emitted near-field profile and a resulting reduction of the vertical far-field profile. With a constant thickness of the p-side waveguide, the lower radiation density at the front facet of the laser diode also allows an increased power loss due to COMD (catastrophic optical mirror damage) to be achieved, as in D. Botez, Appl. Phys. Lett. 74(21), 3102 (1999). Furthermore, the far field angles can be reduced, as can be seen especially in FIG. 4 $d$), where a reduction of the asymmetry without changing the p-waveguide thickness allows a reduction of the far field by more than 10°. Although this is done at the cost of mode confinement, it can also be advantageous for low temperature applications, for example. FIG. 5 $a$) also shows that the power curves for the mode inclusions $\Gamma=0.46\%$ and $\Gamma=0.54\%$ are very similar, which is why no significant losses in the power characteristics of the laser diodes have to be accepted if the far field is improved.

The ETAS design according to the invention with triple asymmetry, for example with asymmetric GRIN intermediate layers, provides a new design freedom that can be used either for increased conversion efficiency and reduced temperature sensitivity (due to increased mode confinement) or for greater usable power due to higher COMD power (corresponding to reduced mode confinement) and lower divergence.

Preferably, the sum of the layer thickness of the first waveguide layer and the layer thickness of the second waveguide layer is greater than 1 µm, more preferably greater than 1.5 µm and even more preferably greater than 2 µm. Preferably, the sum of the layer thickness of the first waveguide layer and the layer thickness of the second waveguide layer is less than 10 µm, more preferably less than 5 µm, more preferably less than 4 µm and even more preferably less than 3 µm. This design enables a vertical far field of less than 60° to be achieved for the fundamental mode, within which 95% of the radiant power is included or radiated (FF95%). Furthermore, a small proportion of the fundamental mode within the p-type waveguide layer (preferably <15%, for example with a 150 nm thick p-type waveguide layer and a total thickness of 1.15 µm) leads to the lowest possible optical absorption loss.

The layer thickness of the second waveguide layer is preferably less than 500 nm, preferably less than 350 nm, preferably less than 250 nm, preferably less than 150 nm, preferably less than 100 nm and even more preferably less than 50 nm. The layer thickness of the second waveguide layer is preferably greater than 5 nm, more preferably greater than 10 nm and even more preferably greater than 25 nm.

The layer thickness of the first intermediate layer shall preferably be less than 500 nm, more preferably less than 350 nm, more preferably less than 300 nm, more preferably less than 200 nm, more preferably less than 150 nm, more preferably less than 75 nm and still preferably less than 30 nm. Preferably, the layer thickness of the first intermediate layer is greater than 5 nm, more preferably greater than 10 nm and even more preferably greater than 25 nm.

The layer thickness of the second intermediate layer is preferably less than 500 nm, more preferably less than 350 nm and more preferably less than 300 nm, more preferably less than 150 nm and even more preferably less than 75 nm. The layer thickness of the second intermediate layer is preferably greater than 5 nm, more preferably greater than 10 nm and even more preferably greater than 25 nm.

Due to a small layer thickness of the second waveguide layer, a low optical loss and a low ohmic resistance can be achieved. Preferably, the difference between the maximum refractive index of the first waveguide layer and the refractive index of the first cladding layer is less than 0.07. This can advantageously be achieved by suppressing or completely eliminating upper modes. The difference of the refractive indices must be so large that in active operation thermally and electronically induced refractive index changes, whose magnitude is typically less than 0.01, have no influence on the laser properties. As a result, the fundamental mode is stable against temperature or charge carrier effects (i.e. mainly defined by waveguide and cladding layers). The difference between the maximum refractive index of the first waveguide layer and the refractive index of the first cladding layer lies between 0.045 and 0.005, more preferably between 0.04 and 0.01 and even more preferably between 0.04 and 0.015 in a particularly preferred embodiment. Also preferably the difference between the maximum refractive index of the first waveguide layer and the refractive index of the first cladding layer is less than or equal to 0.1, more preferably less than or equal to 0.05, more preferably less than or equal to 0.04, and even more preferably less than or equal to 0.035, further preferably the difference between the maximum refractive index of the first waveguide layer and the refractive index of the first cladding layer is greater than or equal to 0.01 and more preferably greater than or equal to 0.015.

Preferably, within the first intermediate layer, the refractive index, starting from the active layer, decreases towards the first waveguide layer by at least 0.03 or by 30% of the difference between the maximum refractive index of the first intermediate layer and the minimum refractive index of the first waveguide layer. The n-side intermediate layer thus bridges at least 0.03 or 30% of the refractive index step between the maximum refractive index of the first intermediate layer and the minimum refractive index of the first waveguide layer. Within the first intermediate layer, the refractive index falls more preferably by at least 0.05 or 50% of said difference and even more preferably by 0.07 or 70% of said difference. In particular, the decreasing refractive index profile within the first intermediate layer can be a continuously decreasing function of the layer thickness.

Preferably, the refractive index within the first intermediate layer decreases monotonously as a function of layer thickness from the maximum refractive index of the active layer to the minimum refractive index of the first waveguide layer. Preferably, the minimum refractive index of the first waveguide layer is at the boundary to the first cladding layer.

Preferably, within the second intermediate layer, the refractive index, starting from the active layer, does not decrease in the direction of the second waveguide layer, but has a constant value throughout the second intermediate layer. In an alternative embodiment, within the second intermediate layer, the refractive index decreases by at least 9% of the difference between the maximum refractive index of the second intermediate layer and the minimum refractive index of the second waveguide layer. The p-side intermediate layer thus bridges at least 9% of the refractive index jump between the maximum refractive index of the second intermediate layer and the minimum refractive index of the second waveguide layer. In particular, the decreasing refractive index profile within the second intermediate layer can be a continuously decreasing function of the layer thickness. Preferably, the refractive index within the second intermediate layer decreases continuously as a function of layer thickness from the maximum refractive index of the active layer to the minimum refractive index of the second waveguide layer. Preferably the minimum refractive index of the first waveguide layer is at the boundary to the second cladding layer.

Preferably the waveguide layers and the cladding layers are uniform. The uniformity preferably extends over its entire length, which is located between the facets of the laser diode, even more preferably over its entire extension. Uniformity in the sense of the present application means that the layer parameters (such as chemical composition, doping, layer thickness, refractive index) over the above-mentioned extension are relatively less than 10% (maximum to minimum), more preferably less than 5%, more preferably less than 1% and even more preferably not at all different.

Preferred material of the first cladding layer is $Al_xGa_{1-x}As$, more preferred material composition is between $Al_{0.28}Ga_{0.72}As$ and $Al_{0.32}Ga_{0.68}As$. The first coat layer preferably has a thickness between 0.5 µm and 4 µm. Preferred material of the first waveguide layer is $Al_xGa_{1-x}As$, more preferred material composition is between $Al_{0.10}Ga_{0.90}As$ and $Al_{0.32}Ga_{0.65}As$. The first waveguide layer preferably has a layer thickness between 0.5 µm and 3 µm.

All compound semiconductors consisting of elements of the 3rd main group (Al, Ga, In) and the 5th main group (N, P, As and Sb) of the periodic table of elements, which produce the desired difference between the refractive index of the first waveguide layer and the refractive index of the first cladding layer, can be considered as materials of the first cladding layer and the first waveguide layer. Preferably the first waveguide layer and the second waveguide layer are made of the same material. The refractive index of the first cladding layer is preferably lower than the refractive index of the first waveguide layer. The refractive index of the second cladding layer is preferably lower than the refractive index of the second waveguide layer.

Preferred material of the active layer is an InGaAs MQW (multi quantum well), preferred an InGaAs DQW (double quantum well) and even more preferred an InGaAs SQW (single quantum well). Possible materials of the active layer are all compound semiconductors consisting of elements of the 3rd main group (Al, Ga, In) and the 5th main group (N, P, As and Sb) of the periodic table of elements, e.g. as GaAsP, InGaAsP, AlInGaAs, InGaAsNSb. The preferred material of the second waveguide layer is $Al_xGa_{1-x}As$, preferably with a molar Al content x as small as possible for minimum electrical resistance; for a wavelength of 940 nm at the interface between the second intermediate layer and the second waveguide layer preferably less than 0.4, more preferably less than 0.3 and more preferably less than or equal to 0.25, and at the interface between the second waveguide layer and the second cladding layer preferably less than 0.95, more preferably less than 0.9 and more preferably less than 0.85.

Preferably the active layer has a (total) layer thickness smaller than 80 nm, preferably smaller than 60 nm, preferably smaller than 40 nm and even more preferably smaller than 20 nm.

Preferably the active layer has at least one quantum well without barrier layers. In an alternative preferred embodiment, the active layer has at least one well layer and at least two barrier layers. Preferably the layer thickness of the layer containing at least one well is between 1 nm and 25 nm, preferably between 5 and 20 nm. Preferably the layer thicknesses of the layer containing at least one well are uniform and equal. Preferably, the layer thicknesses of the optional barrier layers are uniform and identical. The number of well layers is preferably less than 15, preferred less than 10, preferred less than 5 and even more preferred less than 3. The total layer thickness of the active layer (with all well and barrier layers) is preferably less than 80 nm, preferred less than 60 nm, preferred less than 40 nm and even more preferred less than 20 nm.

Preferably the active layer is uniform. Preferably, the uniformity of the active layer extends over its entire length, which is located between the facets of the laser diode, even more preferably over its entire extent. Uniformity of the active layer in the sense of the present application means that the layer parameters (such as chemical composition, doping, layer thickness, refractive index) over the above-mentioned extension are relatively less than 10% (maximum to minimum), preferred less than 5%, preferred less than 1%, and even more preferred not at all different.

Preferably, the active layer extends over the entire range between a reflection facet and an exit facet. Preferably, an active layer contacts both the reflection facet and the exit facet directly. The active layer can also be spaced from the facets in a range between 0 μm and 500 μm, for example by using implantation, intermixing or overgrowth to prevent laser failure by destroying the facet(s).

Preferably the surfaces of the reflection facet and the exit facet are planar. Preferably the surfaces of the reflection facet and the exit facet are arranged parallel to each other. Preferably, the longitudinal axis of the first waveguide layer and the longitudinal axis of the second waveguide layer run perpendicular to the surfaces of the reflection facet and the exit facet. A ribbed waveguide is preferably used to control the lateral far field.

Preferably the first intermediate layer and the second intermediate layer consist of $Al_xGa_{1-x}As$. Preferably, the molar Al content x of the first intermediate layer at the interface between the first intermediate layer and the active layer has a value of greater than or equal to 0, more preferably greater than 0.05 and even more preferably greater than 0.1, and the molar Al content x of the first intermediate layer at the interface between the first waveguide layer and the first intermediate layer is greater than 0.05, more preferably greater than 0.1, more preferably greater than 0.15 and even more preferably greater than 0.2. For example, the difference between the maximum refractive index of a first waveguide layer (exemplarily consisting of $Al_{0.25}Ga_{0.75}As$) and the maximum refractive index of a first intermediate layer (exemplarily consisting of $Al_{0.15}Ga_{0.85}As$) at the interface between the first waveguide layer and the active layer is 0.07. This difference value is particularly preferred to be greater than 0.03, preferred to be greater than 0.05 and even more preferred to be greater than 0.07.

The formation of a refractive index gradient in at least one of the waveguide layers, preferably the first waveguide layer, is advantageous because this leads to a favorable intensity profile of the fundamental mode and thus to a low laser threshold. Due to the design according to the invention, it is possible to determine the intensity of the fundamental mode within the quantum film without having to adjust the thickness of the p-intermediate layer or the thickness of the waveguide layers. If, however, the fundamental mode lies too far within one of the waveguide layers, the laser threshold would rise sharply, so that the formation of a refractive index gradient can lead to a more favorable positioning of the fundamental mode in the waveguide.

In a particularly preferred embodiment, the first waveguide layer and the second waveguide layer have a refractive index gradient (e.g. by varying the aluminium content along the layer thickness), whereby in the case of $Al_xGa_{1-x}As$ waveguide layers the molar Al content x of the second waveguide layer can be varied between 10% and 95% and in the case of the first waveguide layer between 10% and 32%. Preferably, the refractive index changes linearly from one side to the other in the case of a refractive index gradient.

Preferably the refractive index of a waveguide layer is lower at the interface to the cladding layer than at the interface to the intermediate layer. Preferably, the refractive index of a waveguide layer varies continuously from the interface to the cladding layer to the interface to the intermediate layer. Preferably, the refractive index gradient is generated by a material-specific composition profile in the semiconductor. For example, in the material system $Al_xGa_{1-x}As$ the refractive index gradient can be generated by a gradient of the molar Al content x. If the second waveguide layer has a composition profile, $Al_xGa_{1-x}As$, with a molar Al content between $Al_{0.15}Ga_{0.85}As$ and $Al_{0.85}Ga_{0.15}As$, is preferably used.

Preferably, the diode laser according to the invention is designed for continuous wave operation. Preferably, an electrical control for the diode laser is designed in such a way that the diode laser operates in continuous wave mode. The diode laser is preferably designed as an edge-emitting diode laser. The diode laser is preferably designed as an optical amplifier.

Preferably, a carrier substrate is provided on which the aforementioned layer structure is built up. Preferably, the n-type layers are arranged on the side of the active layer facing the carrier substrate, whereas the p-type layers are arranged on the side of the active layer facing away from the carrier substrate. The diode laser preferably has contact layers for the injection of charge carriers.

BRIEF DESCRIPTION OF THE FIGURES

The invention is explained in the following examples using the corresponding figures. It is shown.

DETAILED DESCRIPTION OF THE FIGURES

Figure 1:
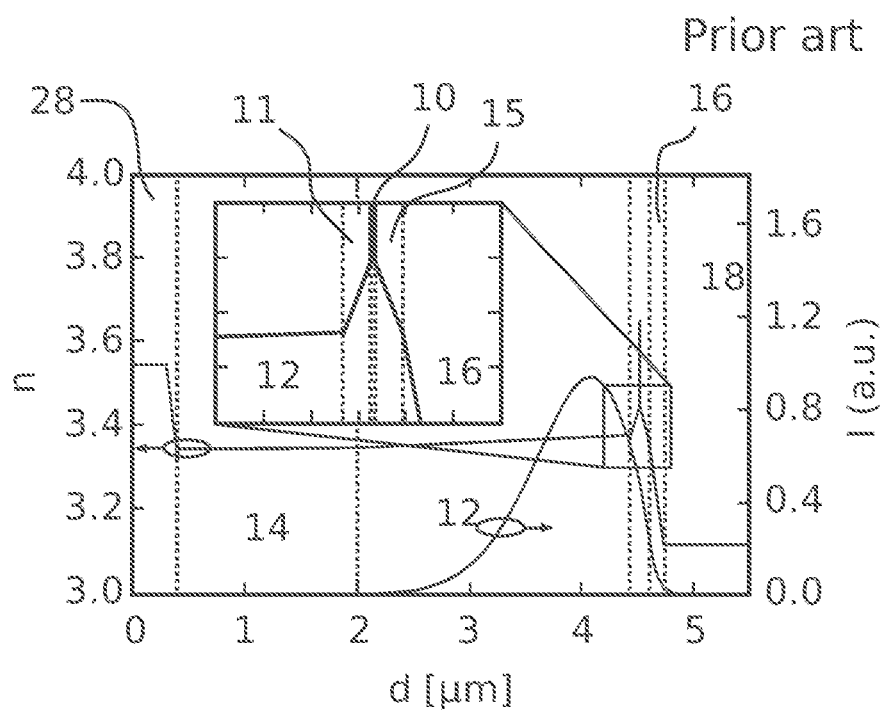
FIG. 1 the state of the art refractive index distribution along the layers of a conventional EDAS laser diode and the corresponding vertical distribution of the mode intensity in the laser diode, FIG. 2A the refractive index distribution along the layers of a first embodiment of an ETAS laser diode according to the invention and the associated vertical distribution of the mode intensity in the laser diode, FIG. 2B the refractive index distribution along the layers of a second embodiment of an ETAS laser diode according to the invention and the associated vertical distribution of the mode intensity in the laser diode, FIG. 3A a laser diode according to the invention in schematic perspective, FIG. 3B The laser diode according to the invention from FIG. 2A in schematic cut representation along an axis transverse to the direction of light propagation, FIG. 3C The laser diode according to invention from FIG. 2A in schematic cut representation along an axis parallel to the light propagation direction, FIG. 4 the simulated dependencies of the mode confinement (a, c) and the vertical far field (b, d) on the strength of the asymmetry ratio and the layer thickness of the second waveguide layer.

FIG. 1 shows the state of the art refractive index distribution along the layers of a conventional EDAS laser diode and the corresponding vertical distribution of the mode intensity in the laser diode. The laser diode has a layered structure with an n-type first cladding layer 14, an n-type first waveguide layer 12 arranged thereon, an n-type first intermediate layer 11 (GRIN layer) arranged thereon, an active layer 10 arranged thereon, a p-type second intermediate layer 15 (GRIN layer) arranged thereon, a p-type second waveguide layer 16 arranged thereon and a p-type second cladding layer 18 arranged thereon. These layers are arranged on a substrate 28. The respective thicknesses of the first intermediate layer 11 and the second intermediate layer 15 are the same, i.e. the active layer 10 is arranged in the middle between the plotted interfaces of the first intermediate layer 11 with the first waveguide layer 12 and the second intermediate layer 15 with the second waveguide layer 16. In particular, as with all state of the art EDAS laser diodes, the asymmetry ratio of the thickness of the first interlayer 11 to the sum of the thickness of the first interlayer 11 and the thickness of the second interlayer 15 is 0.5.

In the EDAS design shown, the maximum intensity of the plotted fundamental mode is clearly outside the active layer (i.e. low mode inclusion) and far within the first waveguide range 12. With the active layer 10, the mode can only interact via its steeply sloping p-side edge with low intensity and small mode overlap.

Figure 2A:
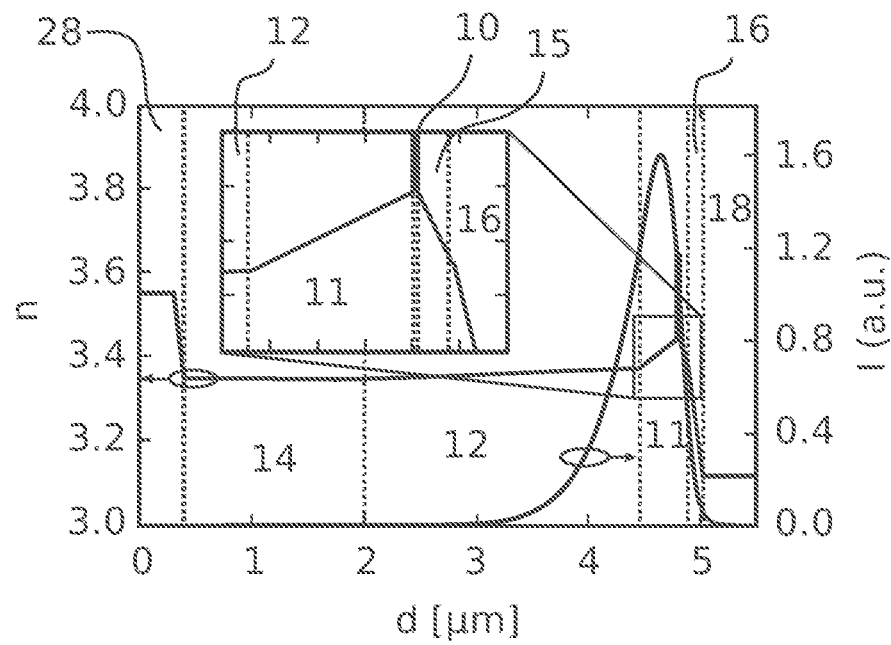

FIG. 2A shows the refractive index distribution along the layers of a first embodiment of an ETAS laser diode according to the invention and the corresponding vertical distribution of the mode intensity in the laser diode. The layer structure shown essentially corresponds to the structure shown in FIG. 1. The respective reference signs apply accordingly. In contrast to the illustration in FIG. 1, however, an additional asymmetry with respect to the thickness of the first intermediate layer 11 (GRIN layer) and the second intermediate layer 15 (GRIN layer) was realized with the laser diode shown compared to a conventional EDAS design. While the structure of the second intermediate layer 15 in the p-side area largely corresponds to the conventional EDAS design, the thickness of the first intermediate layer 11 was significantly increased in relation to the thickness of the second intermediate layer 15. This means that, in ETAS design, the active layer 10 is no longer centered between the plotted interfaces of the first intermediate layer 11 with the first waveguide layer 12 and the second intermediate layer 15 with the second waveguide layer 16. In particular, the asymmetry ratio of the thickness of the first intermediate layer 11 to the sum of the thickness of the first intermediate layer 11 and the thickness of the second intermediate layer 15 is greater than 0.5 in the illustration.

In the ETAS design shown, the maximum intensity of the plotted fundamental mode moves clearly in the direction of the active layer 10 (i.e. high mode inclusion). In particular, the diagram shows that a large part of the mode intensity is localized within the first interlayer 11. Compared to the illustration in FIG. 1, the mode profile shown shows a lower mode extension (lower mode volume) and a higher spatial overlap with the active layer 10 with an increased maximum intensity at the maximum of the mode.

The mode can therefore interact much more strongly with the active layer 10. The mode confinement is significantly increased.

Figure 2B:
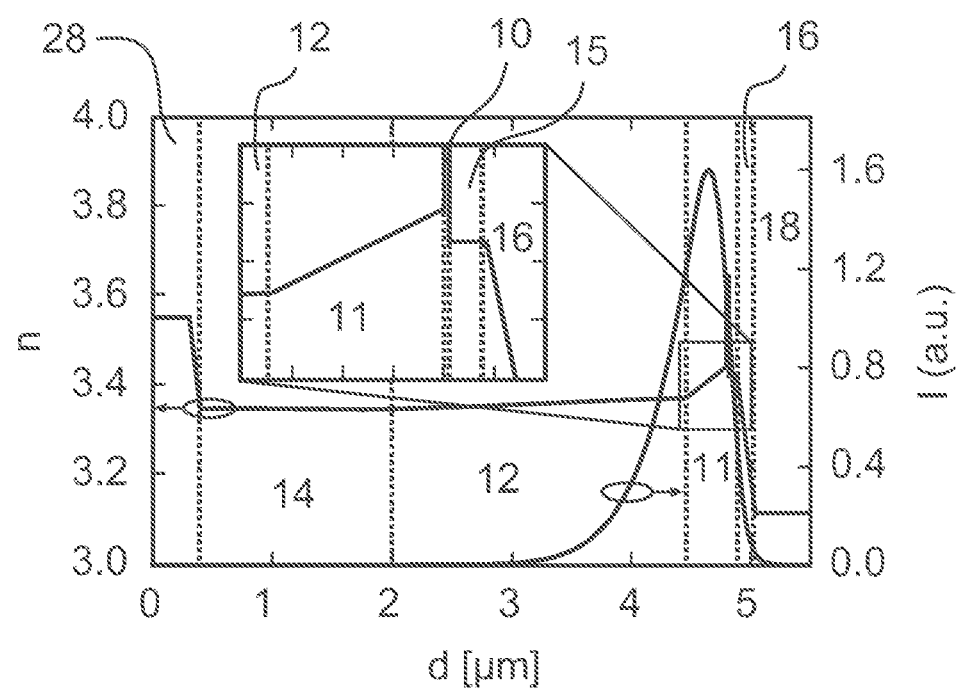

FIG. 2B shows the refractive index distribution along the layers of a second embodiment of an ETAS laser diode according to the invention as well as the corresponding vertical distribution of the mode intensity in the laser diode. The representation essentially corresponds to that shown in FIG. 2B. The respective reference signs apply accordingly. In contrast to the first embodiment according to FIG. 2A, the p-type second intermediate layer 15 of the embodiment shown here is a layer with a constant refractive index. The n-type first intermediate layer 11, on the other hand, is designed as a GRIN layer.

Figure 3A:
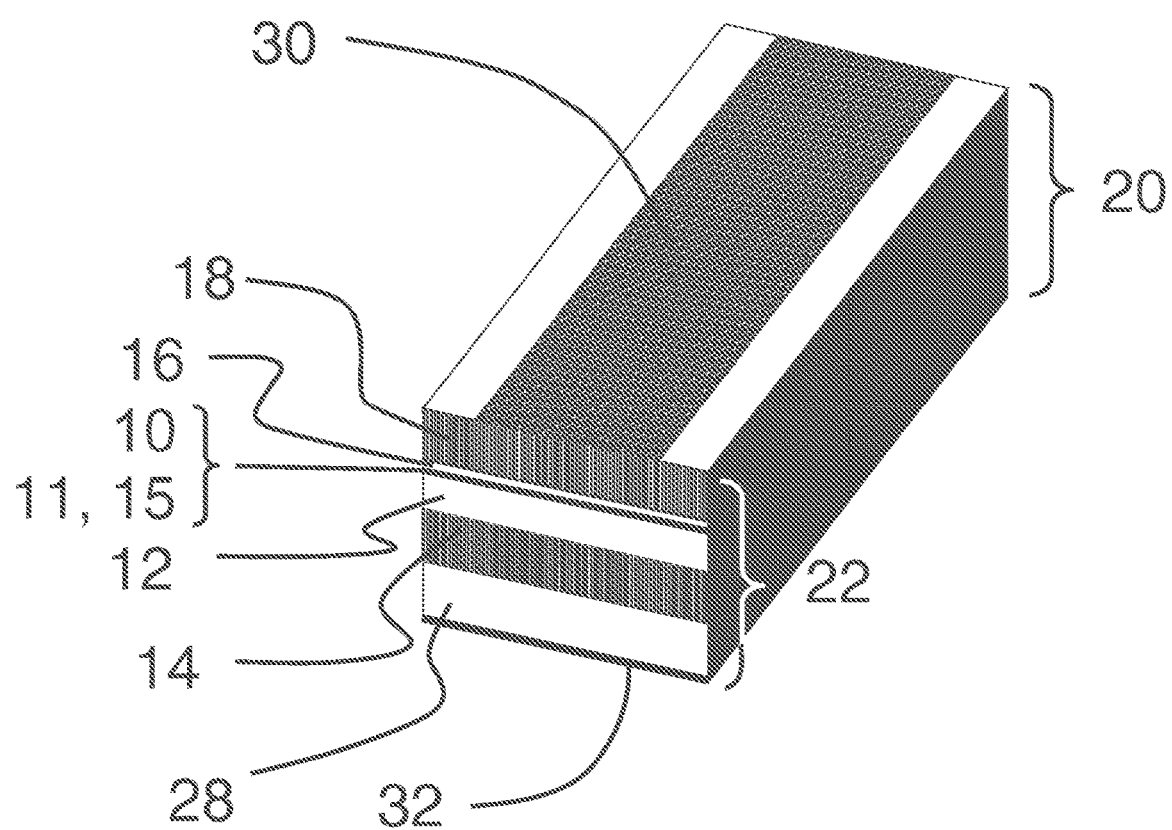
Figure 3B:
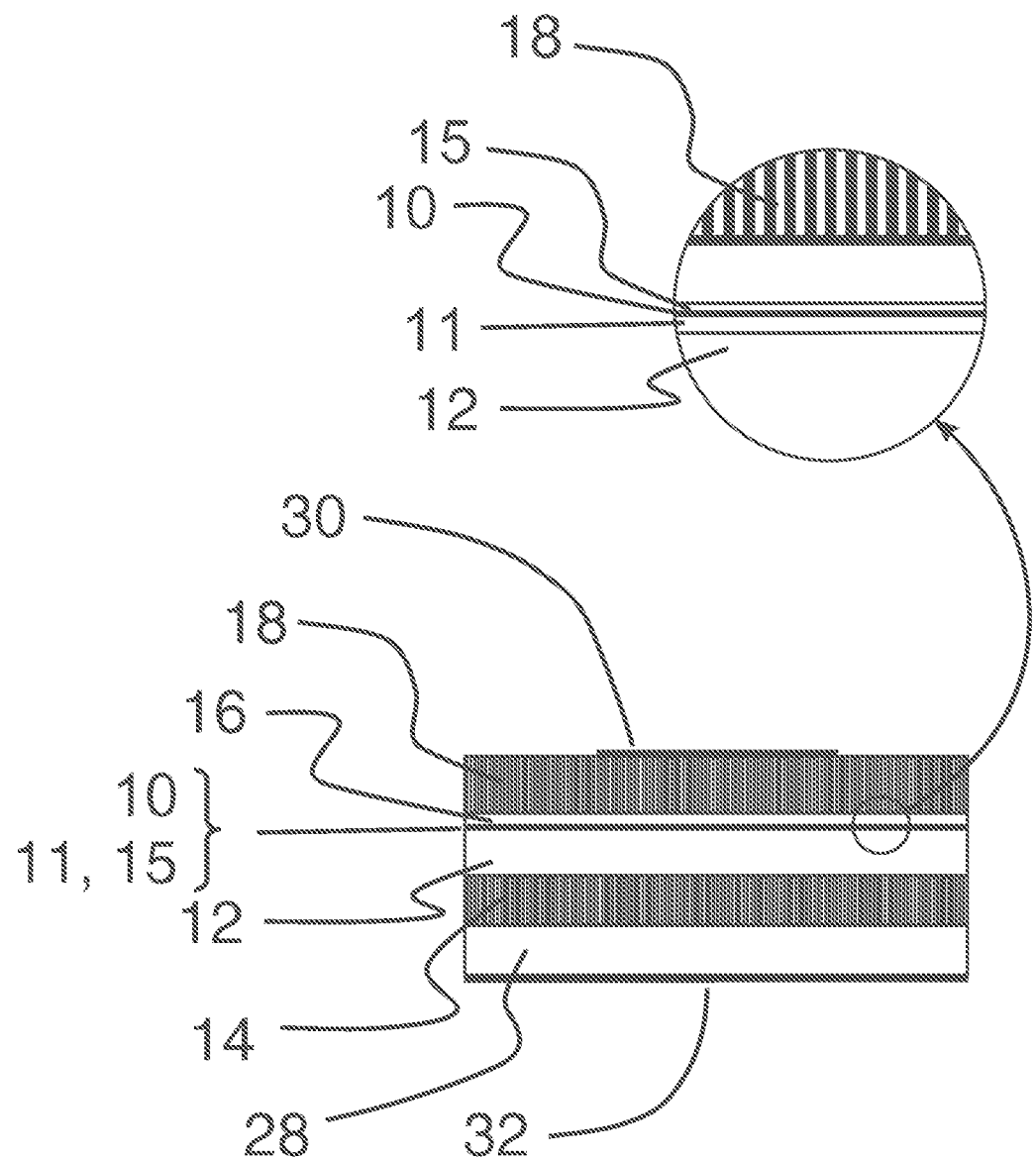
Figure 3C:
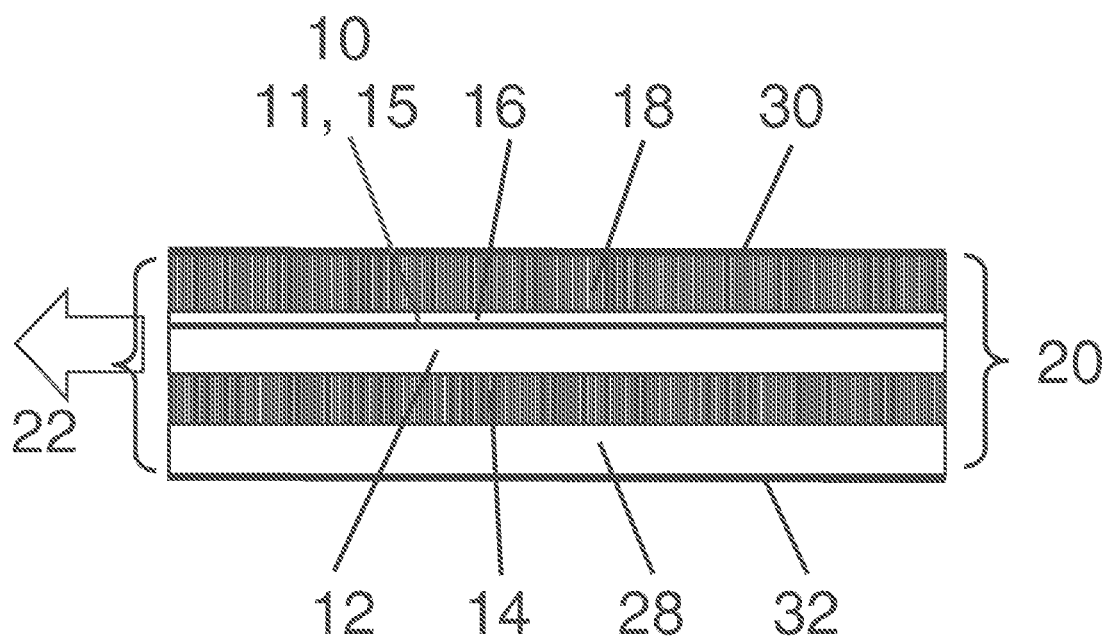

FIG. 3A-3C show a laser diode according to the invention in perspective and cut representation. The laser diode according to the invention has a vertical layer structure with a substrate 28, an n-type first cladding layer 14 arranged thereon, an n-type first waveguide layer 12 arranged thereon, an n-type first intermediate layer 11 arranged thereon, an active layer 10 arranged thereon, a p-type second intermediate layer 15 arranged thereon, a p-type second waveguide layer 16 arranged thereon and a p-type second cladding layer 18 arranged thereon. Furthermore, a first contact for the injection of charge carriers 30 and a second contact for the injection of charge carriers 32 are shown as examples. The exact position of the first intermediate layer 11, the second intermediate layer 15 and the active layer 10 can be seen in the enlarged illustration in FIG. 3B.

Furthermore, the laser diode according to the invention has, at lateral opposite ends, a reflection facet 20 with a high reflectivity for the central wavelength of the radiation emitted by the active layer 10 and an exit facet 22 with a reflectivity that enables the radiation to be decoupled. The reflectivity of the reflection facet 20 is preferably greater than 0.8, more preferably greater than 0.9 and even more preferably greater than 0.99. The reflectivity of the exit facet 22 is preferably less than the reflectivity of the reflection facet 20. The facets 20 and 22 form a cavity so that laser operation can be achieved.

The specific structure of the preferred embodiment shown in FIG. 3A-3C is a diode laser with an active layer 10 with a central emission wavelength at 940 nm, manufactured from an InGaAs quantum film with a thickness of 5.4 nm. Cladding, waveguide and intermediate layers 11, 12, 14, 15, 16, 18 are made of $Al_xGa_{1-x}As$. For waveguides 12 and 16, the molar Al content x in $Al_xGa_{1-x}As$ is preferably 26% and 25%, respectively. The molar Al content x in $Al_xGa_{1-x}As$ is preferably 30% or 70% for the cladding layers 14 and 18 respectively. For the intermediate layers 11, 15 (GRIN layers), the molar Al content x in $Al_xGa_{1-x}As$ at the respective interface to the active layer 10 is preferably 15%. In the preferred embodiment, the layer thickness of the n-type first cladding layer 14 is 1.65 µm, the layer thickness of the n-type first waveguide layer 12 is 2.5 µm, the layer thickness of the n-type first intermediate layer 11 is 350 nm, the layer thickness of the p-type second intermediate layer 15 is 70 nm, the layer thickness of the p-type second waveguide layer 16 is 150 nm and the layer thickness of the p-type second cladding layer 18 is 800 nm.

In an alternative preferred embodiment, the first waveguide layer 12 and the second waveguide layer 16 have a refractive index gradient (by varying the aluminum content along the layer thickness), with the aluminum content varying between 25% and 70% for the second waveguide layer 16 and between 26% and 30% for the first waveguide layer 12.

Figure 4:
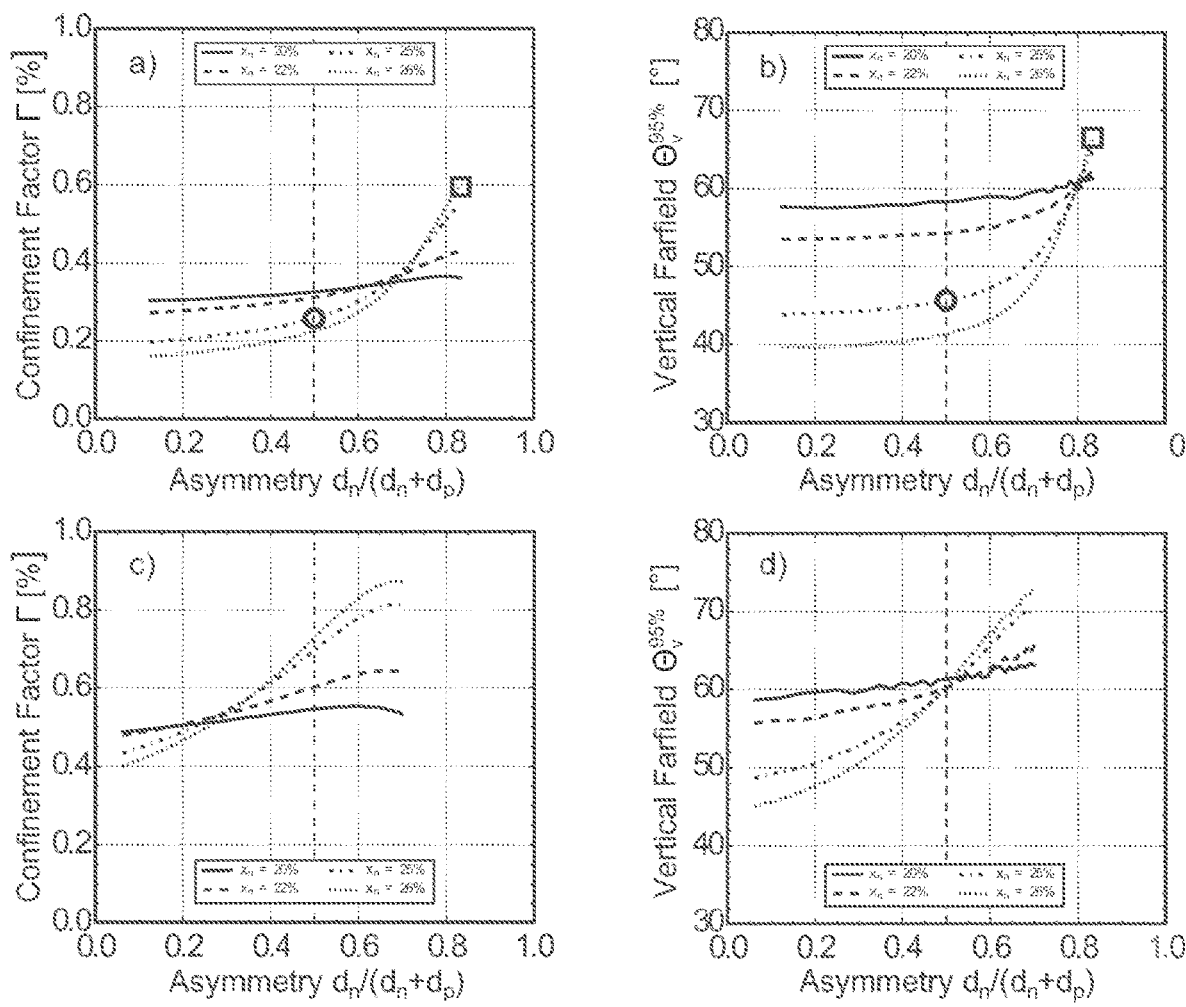

FIG. 4 shows the simulated dependencies of the mode confinement (a, c) and the vertical far field (b, d) on the strength of the asymmetry ratio and the layer thickness of the second waveguide layer. Cladding, waveguide and intermediate layers 11, 12, 14, 15, 16, 18 are assumed to consist of $Al_xGa_{1-x}As$, the layer thickness of the p-type second waveguide layer 16 being 70 nm (a, b) and 150 nm (c, d) respectively. The values for a structure shown in FIG. 1 in accordance with the state of the art are marked in FIG. 4 (a, b) with a ○ ("circle"), while the values for a structure according to the invention are marked with a □ ("square") in accordance with the first embodiment according to FIG. 2. All further information on the simulation parameters can be taken from the description of the laser diode according to the invention shown in FIG. 3A-3C.

The simulation was investigated for different thicknesses of the p-type second intermediate layer 15 (70 nm (a, b), 150 nm (c, d) by changing the thickness of the n-type first intermediate layer 11 (10 nm-350 nm) at different molar Al proportions x at the interface between the n-type first intermediate layer 11 and the first waveguide layer 12. The molar Al content x at the interface between the p-type second intermediate layer 15 and the second waveguide layer 16 is consistently 25% (or 0.25). The active layer consists of a quantum film with a thickness of 5.4 nm. The circles in diagrams a), b) correspond to the vertical structure of a conventional EDAS laser diode shown in FIG. 1. The squares in diagrams a), b) correspond to the vertical structure shown in FIG. 2 of an EDAS laser diode with an additional asymmetry component in the area of the active layer 10 (ETAS laser diode).

Figure 5:
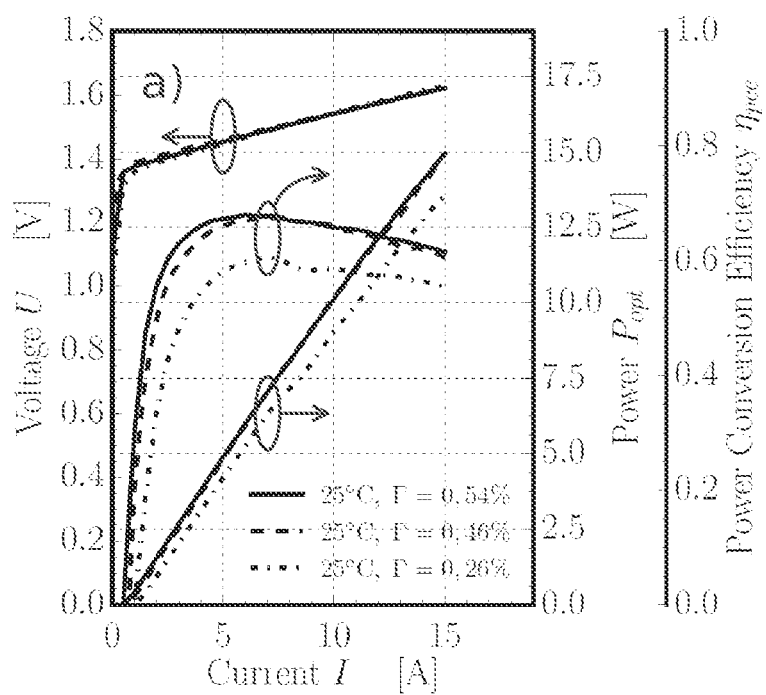
FIG. 5 the power-voltage-current characteristics of three comparable semiconductor laser diodes with different versions of an ETAS embodiments according to the invention at 25° C. (a) and 75° C. (b).
Figure 5:
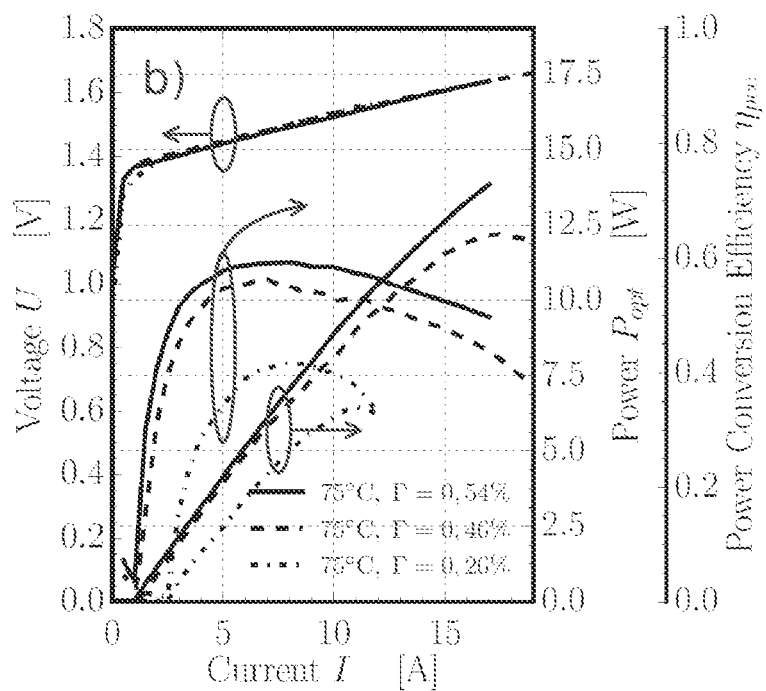

FIG. 5 shows the power-voltage-current characteristics of three comparable semiconductor laser diodes with different embodiments of an ETAS design at 25° C. (a) and 75° C. (b). In the case of the individual ETAS laser diodes, the mode inclusion via the asymmetry ratio was varied according to the invention. These are wide-strip semiconductor lasers for high power operation ($P_{out}$>15 W). If such a semiconductor laser is operated with a conversion efficiency of 55% at the operating point of 15 W, whereby cooling is carried out with an industrially common passive cooling system with a coolant temperature of 25° C., the temperature of the active zone can be assumed to be approx. 62° C. at an average thermal resistance of 3 K/W.

If the characteristic curves of the three laser diodes with ETAS design are now evaluated at 25° C. (a) and 75° C. (b), there are clear differences in the respective power characteristics. All three tested vertical structures have a comparable p-layer structure, which can be seen from the fact that the voltage characteristics of the three diodes do not differ significantly.

At a heat sink temperature of 25° C. (a), no significant power saturation mechanisms can be detected with respect to the mode inclusion. However, the threshold current is higher for structures with smaller mode confinement, which results in a considerable loss of efficiency even at room temperature. Higher threshold currents lead to higher charge carrier densities within the active layer and in the waveguide. This effect results in increased photon absorption on free charge carriers and excessive heat generation, resulting in a self-amplifying effect. The band edges near the quantum film are bent, increasing leakage current rates and further increasing carrier accumulation in the waveguide.

If one now considers the same diodes at an increased heat sink temperature at the operating point of 75° C. (b), it becomes apparent that the saturation mechanisms mentioned above, which are dependent on mode confinement and current, are activated. It can be seen from this that for high performance operation at high operating temperatures it is particularly preferable to strive for a large mode confinement in order to reduce the carrier densities, whereby the p-waveguide should be kept as narrow as possible.

REFERENCE LIST 10 active layer
11 first intermediate layer (n-type)
12 first waveguide layer (n-type)
14 first cladding layer (n type)
15 second intermediate layer (p-type)
16 second waveguide layer (p-type)
18 second cladding layer (p-type)
20 reflection facet
22 exit facet
28 substrate
30 first contact for injection of charge carriers
32 second contact for injection of charge carriers
x molar Al content ($Al_xGa_{1-x}As$)
Γ mode inclusion

The invention claimed is:

1. A diode laser, comprising:
   an n-type first cladding layer,
   an n-type first waveguide layer disposed on said first cladding layer,
   an active layer which is suitable for radiation generation and which is arranged on the first waveguide layer,
   a p-type second waveguide layer disposed on said active layer, a p-type second cladding layer disposed on said second waveguide layer, wherein between the first waveguide layer and the active layer an n-type first intermediate layer is formed as a transition region, and between the second waveguide layer and the active layer a p-type second intermediate layer is formed as a transition region, wherein the boundaries between the individual layers are determined by the fact that at these locations the left-hand and right-hand differential quotient of the refractive index progression differs, wherein the first intermediate layer and/or the second intermediate layer is a GRIN layer, the sum of the layer thickness of the first waveguide layer and the layer thickness of the second waveguide layer being greater than 1 μm, the layer thickness of the second waveguide layer being less than 350 nm, and wherein the difference between the maximum refractive index of said first waveguide layer and the refractive index of said first cladding layer is between 0.04 and 0.01, wherein the asymmetry ratio of the thickness of the first intermediate layer to the sum of the thickness of the first intermediate layer and the thickness of the second intermediate layer is less than or greater than 0.5.

2. The diode laser of claim 1, wherein the layer thickness of the second waveguide layer is less than 150 nm.

3. The diode laser of claim 1, wherein the layer thickness of the first intermediate layer and the layer thickness of the second intermediate layer is less than 350 nm.

4. The diode laser of claim 1, wherein within the first intermediate layer the refractive index, starting from the active layer, decreases in the direction of the first waveguide layer by at least 0.03 or by 30% of the difference between the maximum refractive index of the first intermediate layer and the minimum refractive index of the first waveguide layer.

5. The diode laser of claim 1, wherein the active layer has a layer thickness of less than 80 nm.

6. The diode laser of claim 1, wherein the active layer comprises at least one quantum well.

7. The diode laser of claim 1, wherein the first intermediate layer and the second intermediate layer consist of $Al_xGa_{1-x}As$.

8. The diode laser of claim 7, wherein the molar Al content (x) of the first intermediate layer at the interface between the first intermediate layer and the active layer is greater than 0.

9. The diode laser of claim 7, wherein the molar Al content (x) of the first intermediate layer at the interface between the first waveguide layer and the first intermediate layer is greater than 0.05.

10. The diode laser of claim 1, wherein at least one of the waveguide layers has a refractive index gradient.

11. The diode laser of claim 1, wherein the diode laser is designed as an edge-emitting diode laser or as an optical amplifier.

* * * * *